(12) United States Patent
Wann et al.

(10) Patent No.: US 8,759,920 B2
(45) Date of Patent: Jun. 24, 2014

(54) SEMICONDUCTOR DEVICE AND METHOD OF FORMING THE SAME

(75) Inventors: Clement Hsingjen Wann, Carmel, NY (US); Chih-Hao Chang, Hsinchu (TW); Shou Zen Chang, Panchiao (TW); Chih-Hsin Ko, Fongshan (TW); Yasutoshi Okuno, Kyoto (JP); Andrew Joseph Kelly, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/486,343

(22) Filed: Jun. 1, 2012

(65) Prior Publication Data

US 2013/0320452 A1    Dec. 5, 2013

(51) Int. Cl.
 *H01L 21/70* (2006.01)
(52) U.S. Cl.
 USPC ............................ 257/368; 257/192; 438/196
(58) Field of Classification Search
 USPC ............ 257/368, 217, E27.06, 192, E21.409; 438/368, 299, 196
 See application file for complete search history.

(56) References Cited

U.S. PATENT DOCUMENTS

| 7,732,279 | B2 * | 6/2010 | Park | 438/262 |
| 2012/0056245 | A1 * | 3/2012 | Kang et al. | 257/192 |
| 2012/0202326 | A1 * | 8/2012 | Kronholz et al. | 438/231 |
| 2013/0062701 | A1 * | 3/2013 | Lee et al. | 257/369 |

* cited by examiner

*Primary Examiner* — Jarrett Stark
*Assistant Examiner* — Shahed Ahmed
(74) *Attorney, Agent, or Firm* — Haynes and Boone, LLP

(57) ABSTRACT

A semiconductor device and method for fabricating a semiconductor device is disclosed. An exemplary semiconductor device includes a semiconductor substrate including an active region including a plurality of device regions. The semiconductor device further includes a first device disposed in a first device region of the plurality of device regions, the first device including a first gate structure, first gate spacers disposed on sidewalls of the first gate structure, and first source and drain features. The semiconductor device further includes a second device disposed in a second device region of the plurality of device regions, the second device including a second gate structure, second gate spacers disposed on sidewalls of the second gate structure, and second source and drain features. The second and first source and drain features having a source and drain feature and a contact feature in common. The common contact feature being a self-aligned contact.

16 Claims, 12 Drawing Sheets

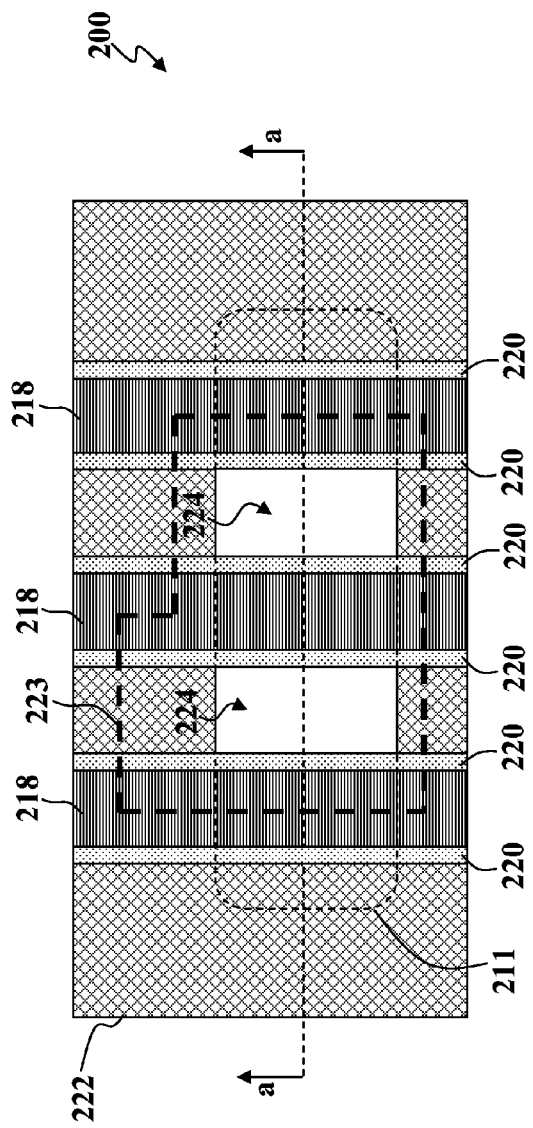
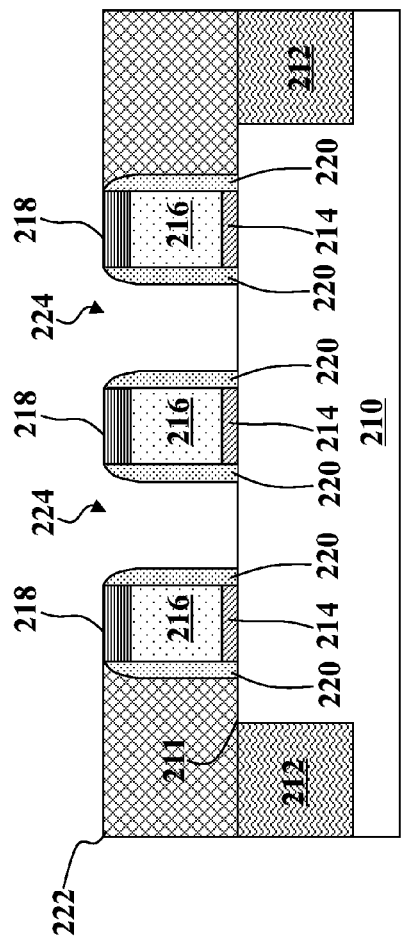
FIG. 4 A
FIG. 4 B

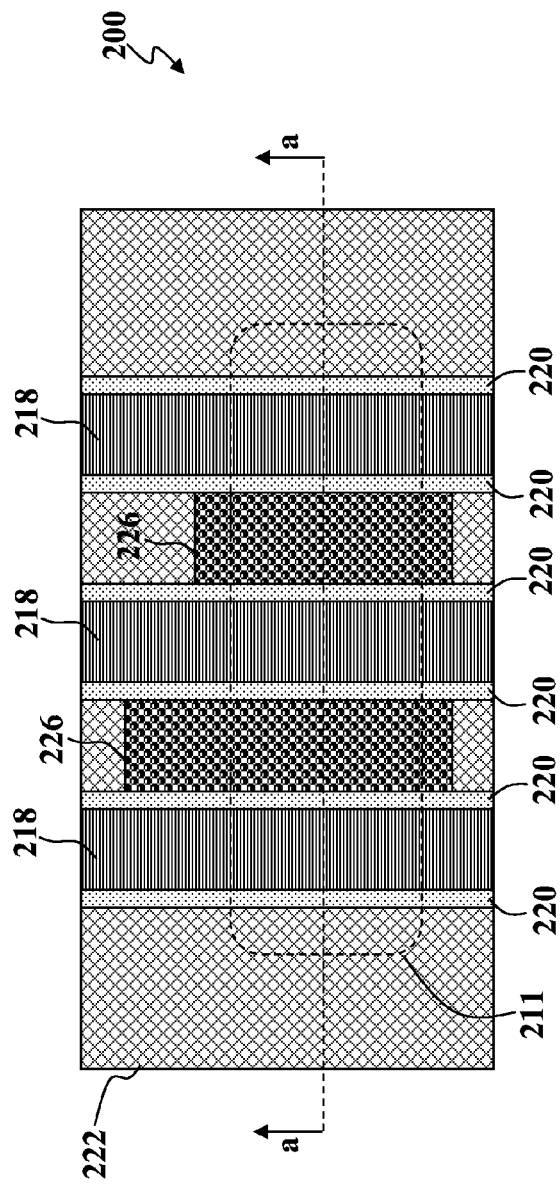
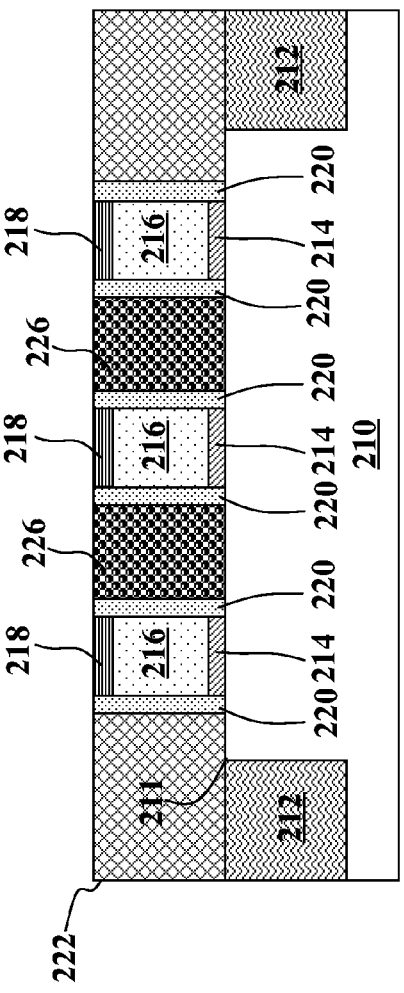
FIG. 5 A
FIG. 5 B

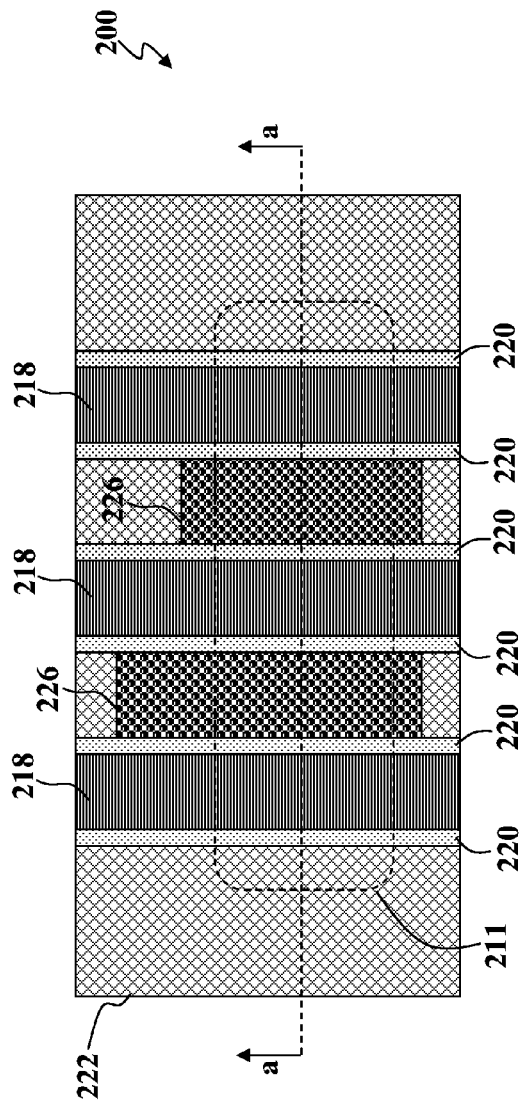
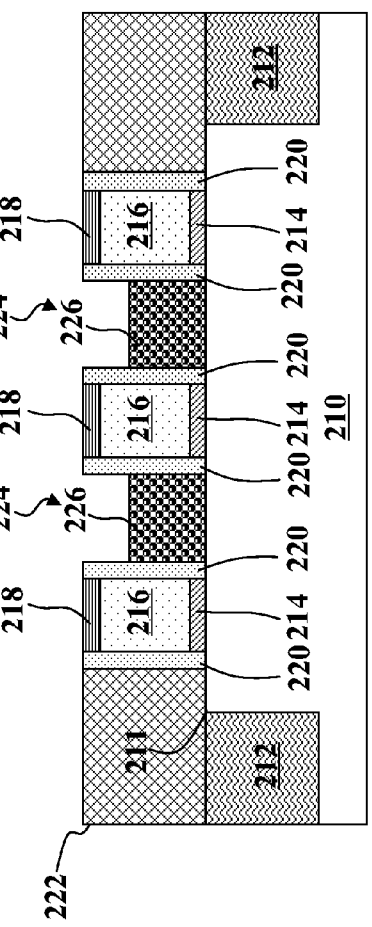
FIG. 6 A
FIG. 6 B

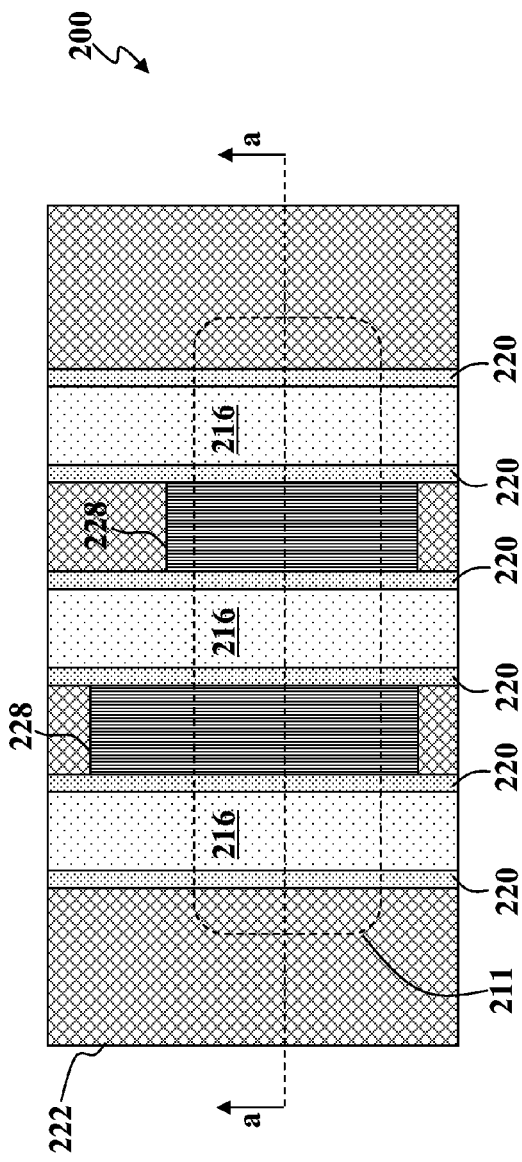
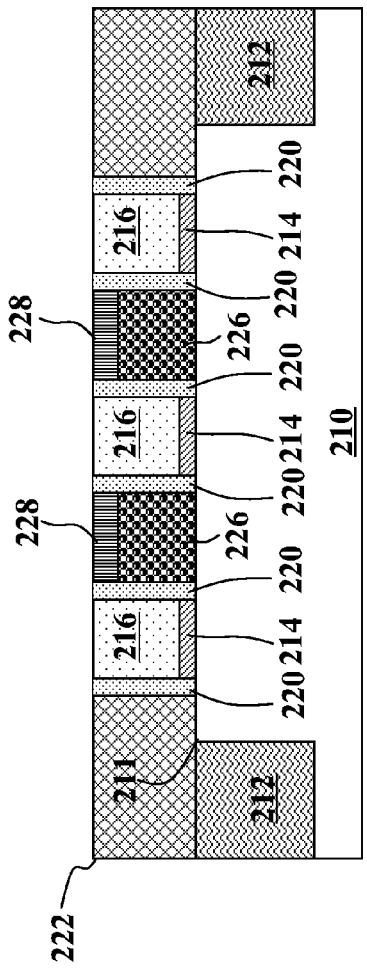
FIG. 8 A
FIG. 8 B

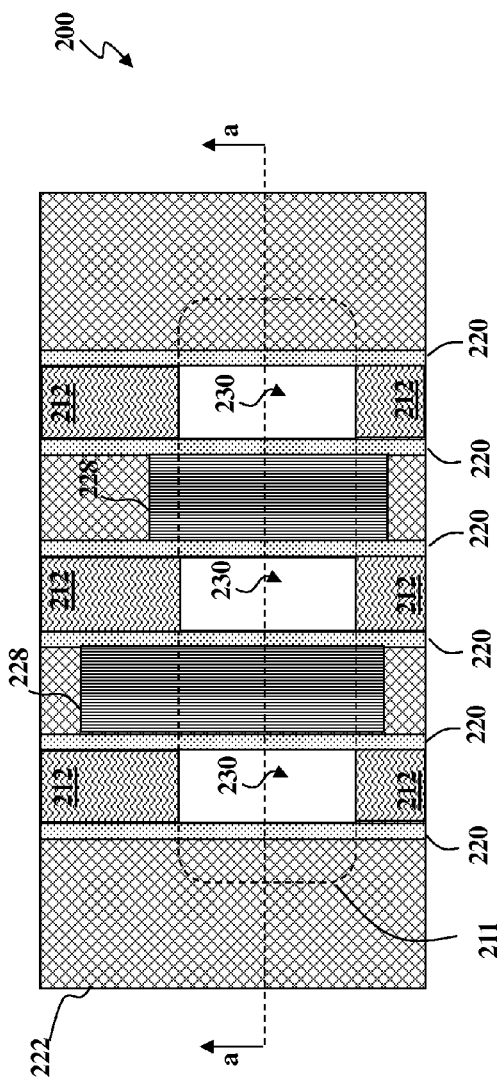
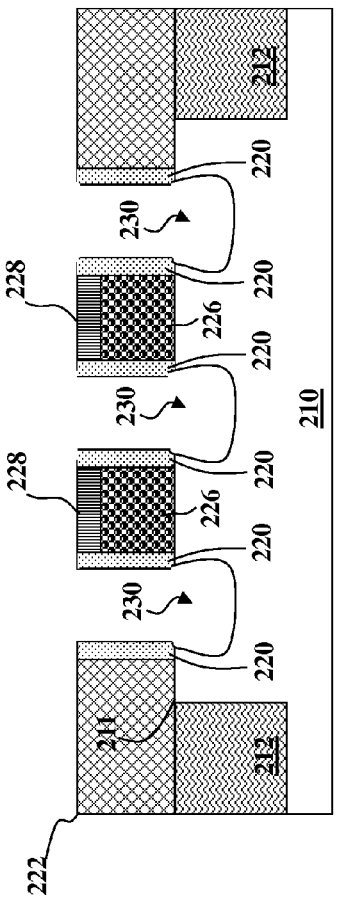
FIG. 9A
FIG. 9B

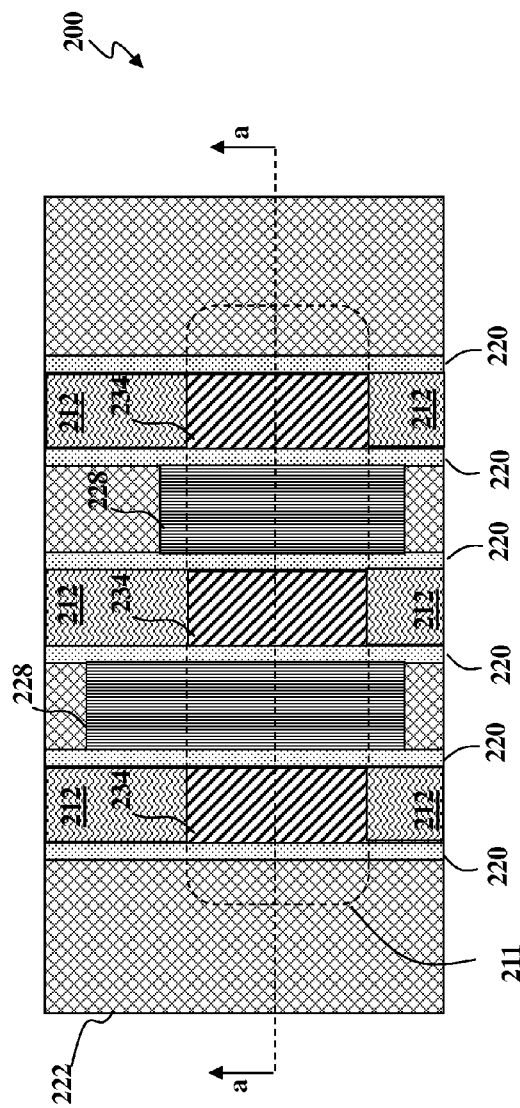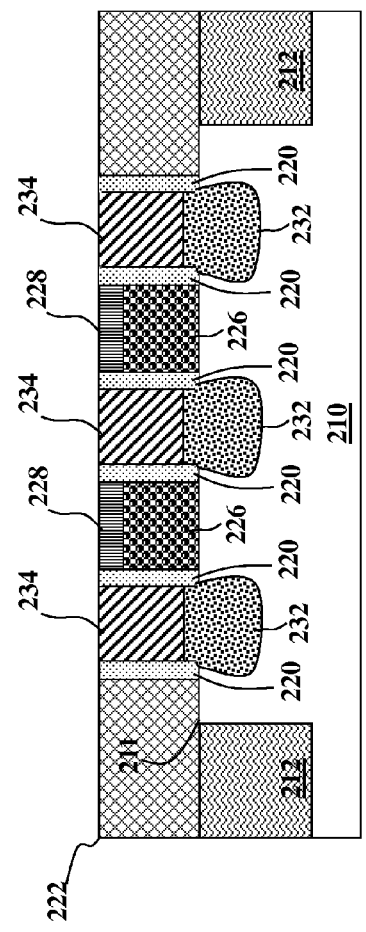
FIG. 10 A
FIG. 10 B

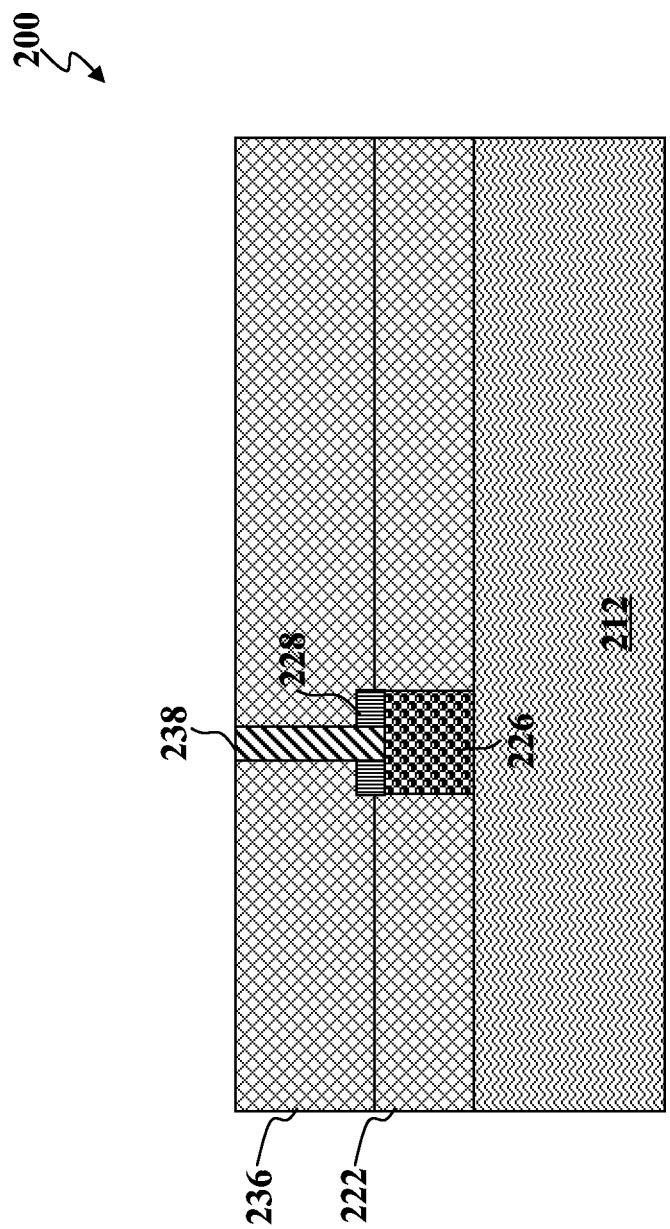

SEMICONDUCTOR DEVICE AND METHOD OF FORMING THE SAME

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of multilayer integrated devices such as field effect transistor (FET). The FET device may include interlayer dielectric layers (ILD) having interconnects aligned with underlying layers. However, as the scaling down continues, aligning the interconnects of the ILD layers has proved difficult. Although existing FET devices and methods of fabricating FET devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-11 illustrate diagrammatic top and cross-sectional side views of one embodiment of a semiconductor device at various stages of fabrication, according to the method of FIG. 1.

DETAILED DESCRIPTION

Figure 1:
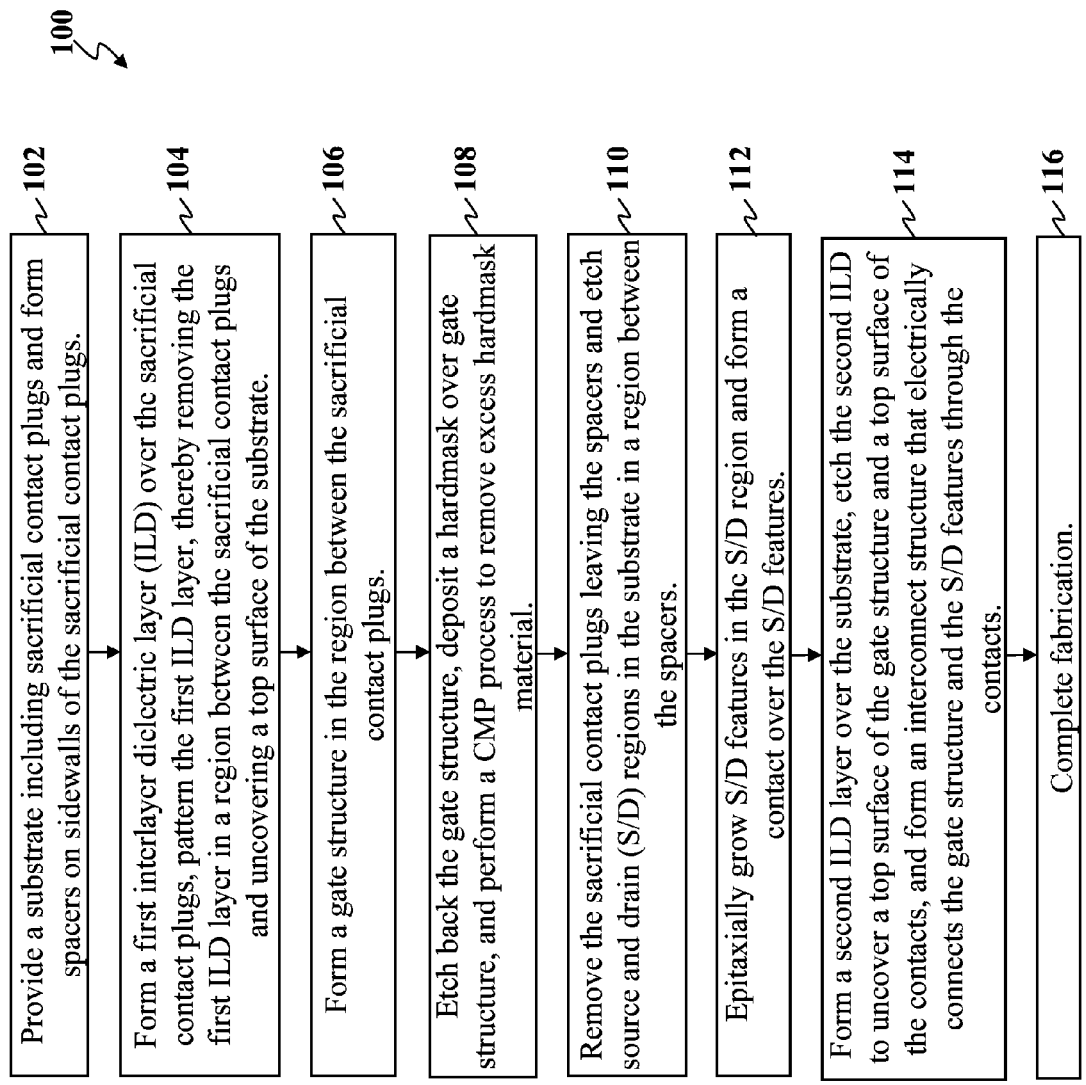
FIG. 1 is a flowchart illustrating a method of fabricating a semiconductor device according to various aspects of the present disclosure.
Figure 2:
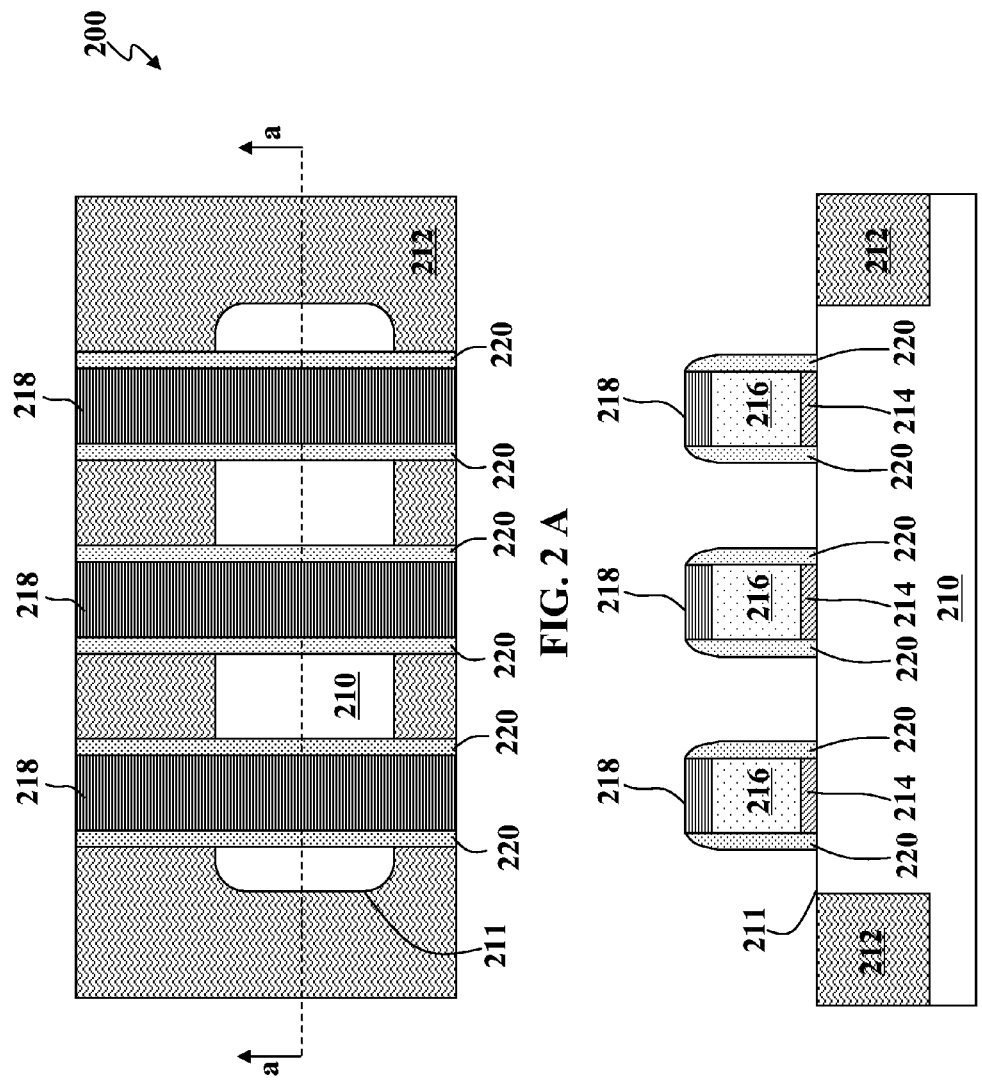
Figure 3:
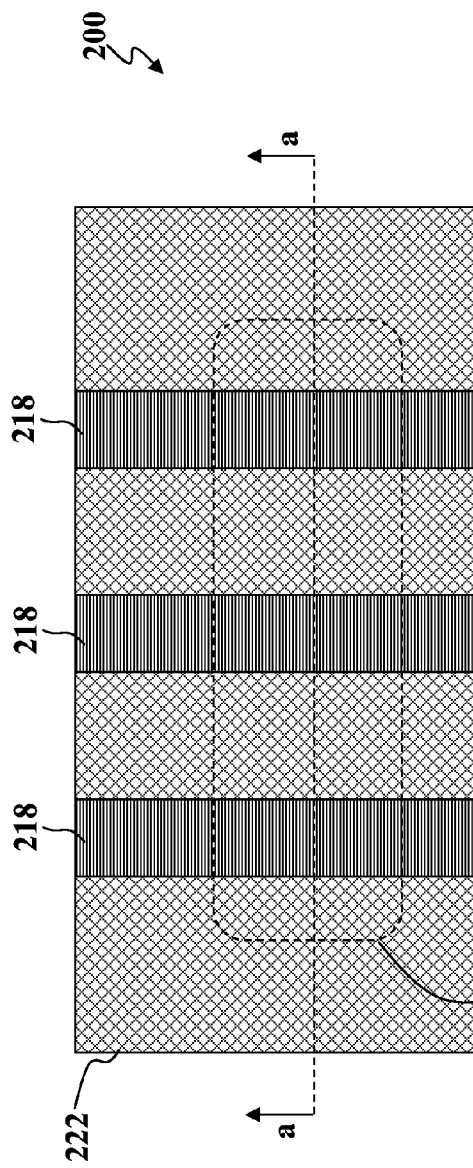
Figure 3:
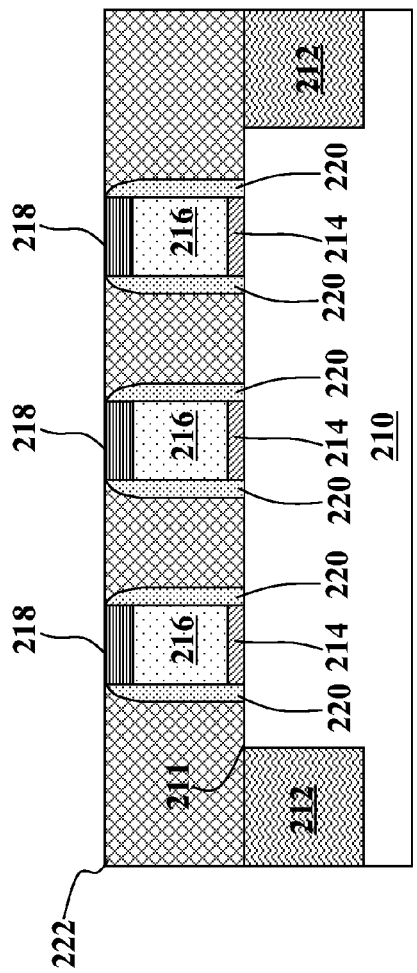

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Examples of devices that can benefit from one or more embodiments of the present invention are semiconductor devices. Such a device, for example, is a field effect transistor (FET). The FET device, for example, may be a complementary metal-oxide-semiconductor (CMOS) device comprising a P-type metal-oxide-semiconductor (PMOS) FET device and a N-type metal-oxide-semiconductor (NMOS) FET device. The devices can be planar FET devices or three dimensional fin-like (Fin) FET devices. The following disclosure will continue with a semiconductor device including a FET device example to illustrate various embodiments of the present invention. It is understood, however, that the invention should not be limited to a particular type of device, except as specifically claimed.

With reference to FIGS. 1 and 2-11, a method 100 and a semiconductor device 200 are collectively described below. FIG. 1 is a flow chart of a method 100 for fabricating an integrated circuit device according to various aspects of the present disclosure. In the present embodiment, the method 100 is for fabricating a field effect transformer (FET) integrated circuit device. The method 100 begins at block 102 where a substrate including sacrificial contact plugs is provided and spacers are formed on sidewalls of the sacrificial contact plugs. The sacrificial contact plugs may include a plurality of contact plugs, based upon design requirements. At block 104, a first interlayer dielectric layer (ILD) is formed over the sacrificial contact plugs, the first ILD layer is patterned, thereby removing the first ILD layer in a region between the sacrificial contact plugs and uncovering a top surface of the substrate. After forming the first ILD layer a chemical mechanical polishing (CMP) process may be performed to remove excess first ILD material. The method continues with block 106 where a gate structure is formed in the region between the sacrificial contact plugs. The gate structure may also be formed over an uncovered top surface of the substrate. At block 108 the gate structure is etched back, a hardmask is deposited over etched back gate structure and between the spacers, and a CMP process is performed to remove excess hardmask material. The etching process may include multiple etching steps/process including dry etching, wet etching, or a combination of both. At block 110, the sacrificial contact plugs are selectively removed leaving the spacers, and source and drain (S/D) regions are etched in the substrate in a region between the spacers. The method continues with block 112 where S/D features are epitaxially grown in the S/D region and contacts are formed over the S/D features. A CMP process may be performed to remove excess contact material. At block 114 a second ILD layer is formed over the substrate, the second ILD is etched to uncover a top surface of the gate structure and a top surface of the contacts, and an interconnect structure is formed that electrically connects the gate structure and the S/D features through the contacts. The method 100 continues with block 116 where fabrication of the integrated circuit device is completed. Additional steps can be provided before, during, and after the method 100, and some of the steps described can be replaced or eliminated for other embodiments of the method. The discussion that follows illustrates various embodiments of a semiconductor device that can be fabricated according to the method 100 of FIG. 1.

FIGS. 2-11 illustrate diagrammatic top and cross-sectional side views of one embodiment of a semiconductor device 200 at various stages of fabrication, according to the method of FIG. 1. Specifically, FIGS. 2A-11A illustrate top views of a semiconductor device 200, FIGS. 2B-11B illustrate cross-sectional side views of the semiconductor device 200 taken along line a-a of FIGS. 2A-11A; and FIG. 11C illustrates a cross-sectional side view of the semiconductor deice 200 taken along line b-b of FIG. 11A. It is understood that the semiconductor device 200 may be fabricated using planar FET technology process flow or FinFET technology process flow. Further, the semiconductor device 200 may include various other devices and features, such as other types of transistors such as bipolar junction transistors, resistors, capacitors, diodes, fuses, etc., Accordingly, FIGS. 2-11 have been simplified for the sake of clarity to better understand the inventive concepts of the present disclosure. Moreover, additional features can be added in the semiconductor device 200, and some of the features described below can be replaced or eliminated in other embodiments of the semiconductor device 200.

Referring to FIGS. 2A-2B, the substrate 210 comprises an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. In the present embodiment, substrate 210 is a bulk silicon substrate. Alternatively, the substrate 210 is a silicon-on-insulator (SOI) substrate. The SOI substrate can be fabricated using separation by implantation of oxygen (SIMOX), wafer bonding, and/or other suitable methods. The substrate 210 may include various doped regions and other suitable features.

In the present embodiment, the substrate 210 includes an isolation region 212 to define and isolate active region 211 of the substrate 210. The isolation region 212 utilizes isolation technology, such as shallow trench isolation (STI) or local oxidation of silicon (LOCOS), to define and electrically isolate the various regions of the device 200. The isolation region 212 can include silicon oxide, silicon nitride, silicon oxynitride, other suitable materials, or combinations thereof. In the present embodiment, the isolation region 212 includes silicon oxide.

Still referring to FIGS. 2A-2B, the substrate 210 includes a dielectric layer 214, a plurality of sacrificial contact plugs 216 formed over the dielectric layer 214, and a hardmask 218 formed over the sacrificial contact plug 216. The dielectric layer 214 may include an interfacial layer formed on the substrate 210. The interfacial layer may include silicon oxide, silicon oxynitride, or any suitable dielectric.

The sacrificial contact plugs 216 may be formed by methods including thermal oxidation, polysilicon deposition, photolithography, etching, and various other methods. The hardmask 218 may be formed by any suitable process to any suitable thickness. For example, the hardmask 218 may be formed by depositing a dielectric material such as silicon oxide, silicon nitride, or other suitable materials. The deposition process may include chemical vapor deposition (CVD), physical vapor deposition (PVD), atomic layer deposition (ALD), high density plasma CVD (HDPCVD), plating, other suitable methods, and/or combinations thereof.

Still referring to FIGS. 2A-2B, spacers 220 are formed on sidewalls of the sacrificial contact plugs 216 and on the substrate 210. The spacers 220 are formed by any suitable process to any suitable thickness. For example, the spacers 220 may be formed by depositing a dielectric material, such as silicon nitride, silicon oxide, silicon oxynitride, other suitable materials, and/or combinations thereof, and patterning the material to form the spacers. In the present embodiment, the spacers 220 include silicon nitride. The deposition process may include chemical vapor deposition (CVD), physical vapor deposition (PVD), atomic layer deposition (ALD), high density plasma CVD (HDPCVD), plating, other suitable methods, and/or combinations thereof.

Referring to FIGS. 3A-3B, formed the device 200 is a first inter-layer (or level) dielectric (ILD) layer 222. The first ILD layer 222 may include silicon oxide, silicon oxynitride, a low-k material, or other suitable materials. In the present embodiment, the first ILD layer includes silicon oxide. Notably, the first ILD layer and the spacers 220 may have different materials such that subsequent processing may selectively remove one of the materials without removing the other. The first ILD layer 222 may be formed by chemical vapor deposition (CVD), high density plasma CVD (HDP-CVD), spin-on, physical vapor deposition (PVD or sputtering), or other suitable methods. The CVD process, for example, may use chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$). After the first ILD layer 222 is formed, a CMP process may be performed to planarize the top surface of the device 200 and remove excess material of the first ILD layer 222. The CMP process may stop on the hardmask 218.

Referring to FIGS. 4A-4B, the first ILD layer 222 is selectively etched in regions 224 between each of the plurality of sacrificial contact plugs 216 such that the spacers 220 remain. The etching process uncovers a top portion of the substrate 210 in the region 224. The etching process may include forming a patterned mask on the first ILD layer 222 that defines the region to be etched. In the present embodiment, for example, the patterned mask is defined as illustrated by dashed region 223. The mask may be patterned by any suitable process, such as a photolithography process. In the present embodiment, the mask is patterned by exposing a photoresist layer to a pattern, performing a post-exposure bake process, and developing the photoresist layer to form the patterned mask. The photoresist layer patterning may include processing steps of photoresist coating, soft baking, mask aligning, exposing pattern, post-exposure baking, developing photoresist, and hard baking. The patterning may also be implemented or replaced by other proper methods, such as maskless photolithography, electron-beam writing, ion-beam writing, and molecular imprint. The patterned mask is used in an etching process that may include wet etching, dry etching, or a combination thereof. After the etching process, the patterned mask is removed.

Referring to FIGS. 5A-5B, a gate structure 226 is formed. The gate structure 226 may include a portion that extends beyond the active region 211 and which is formed over the isolation region 212. Forming the gate structure 226 may include forming a plurality of layers. For example, an interface layer, a dielectric layer, a high-k layer, a capping layer, a work function metal, and a gate electrode may be deposited and be included in the gate structure 226. The high-k layer may include hafnium oxide ($HfO_2$). Alternatively, the high-k layer may optionally include other high-k dielectrics, such as $TiO_2$, $HfZrO$, $Ta_2O_3$, $HfSiO_4$, $ZrO_2$, $ZrSiO_2$, combinations thereof, or other suitable material. Further, the high-k layer may include a multiple layer configuration such as $HfO_2$/$SiO_2$ or $HfO_2$/$SiON$. A suitable work function metal may include for example, TiAl, TaN, WN. Alternatively the work function metal may be any suitable metal. The material of the gate electrode may include any suitable material, for example, a metal including Al, W, or Cu, or polysilicon. The gate structure 226 may be formed by chemical vapor deposition (CVD), physical vapor deposition (PVD), atomic layer deposition (ALD), high density plasma CVD (HDPCVD), plating, other suitable methods, and/or combinations thereof. After the gate structure 226 is formed, a CMP process may be performed to planarize the top surface of the device 200 and remove excess material of the gate structure 226. The CMP process may stop on the hardmask 218.

Referring to FIGS. 6A-6B, the gate structure 226 is recessed in the region 224 by an etch back process or other suitable process. The etching process may include multiple etching steps which may include wet etching, dry etching, or a combination thereof.

Figure 7A:
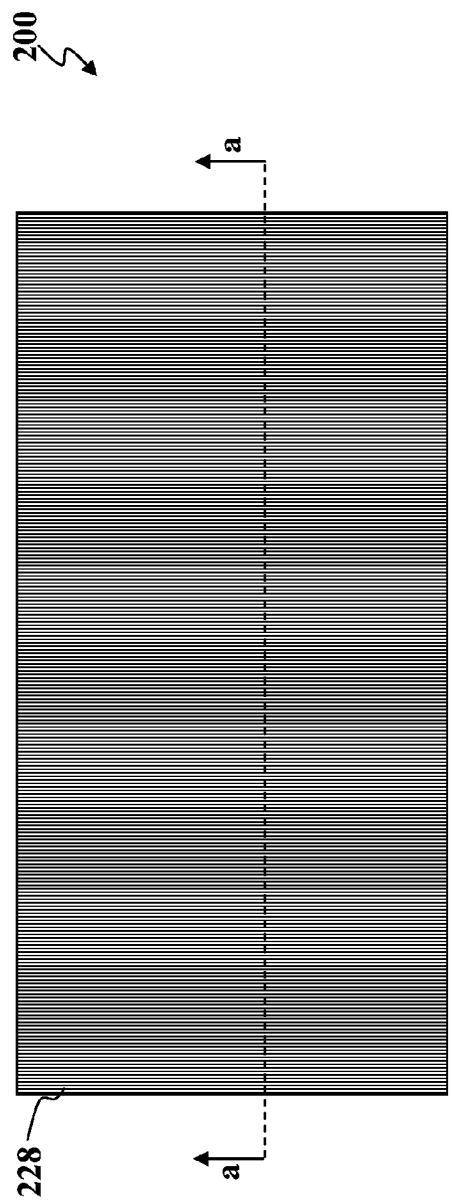
Figure 7B:
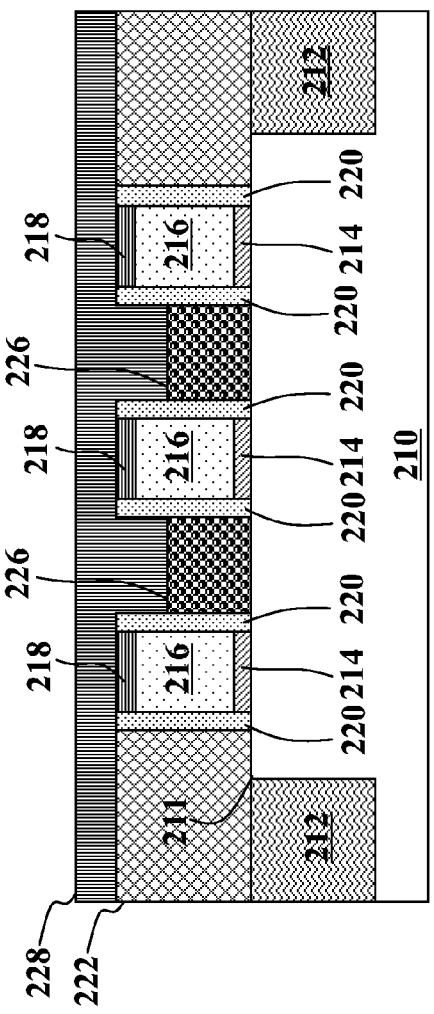
Figure 11:
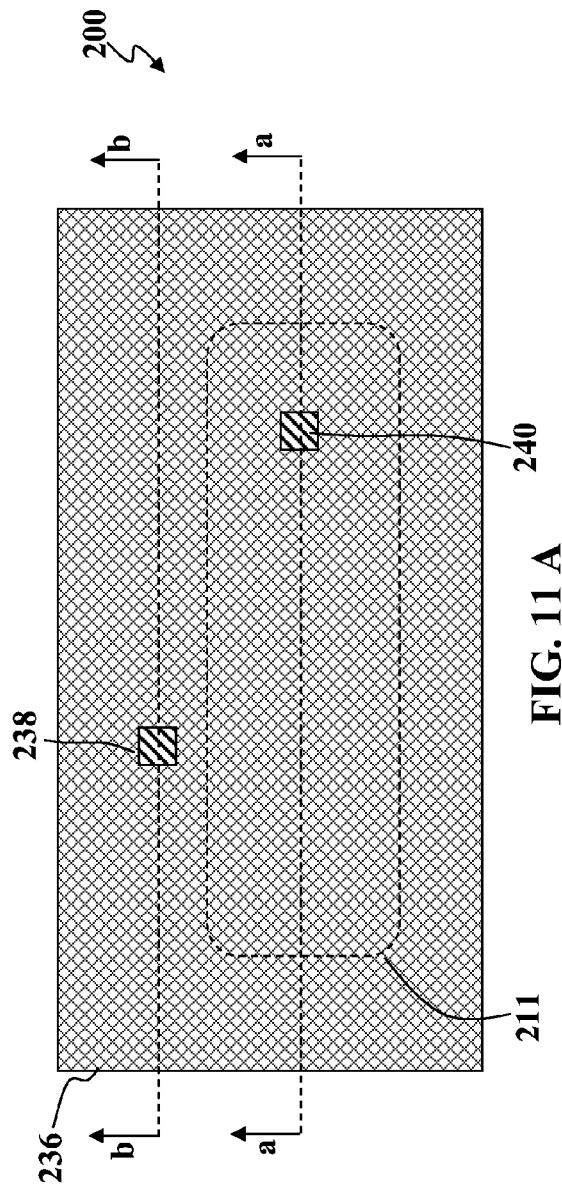
Figure 11:
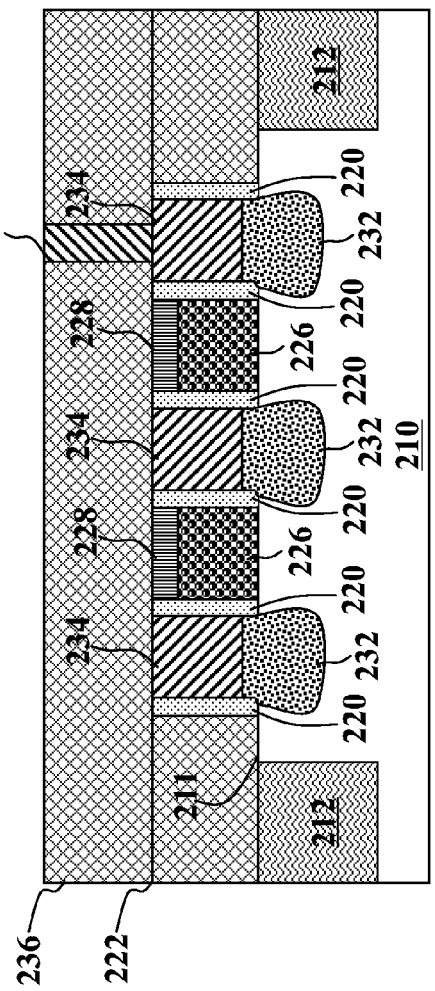

Referring to FIGS. 7A-7B, a hardmask layer 228 is formed over the device 200. The hardmask 228 may include a material such as silicon nitride, silicon oxynitride, silicon carbide, silicon carbon nitride, other suitable material, or combinations thereof. In the present embodiment, the hardmask 228 includes silicon nitride and is formed by a chemical vapor deposition (CVD) process. In various examples, the silicon nitride can be formed by physical vapor deposition (PVD), atomic layer deposition (ALD), high density plasma CVD (HDPCVD), other suitable methods, and/or combinations thereof.

Referring to FIGS. 8A-8B, after the hardmask layer 228 is formed, a CMP process is performed. The CMP process is performed to planarize the top surface of the device 200 thereby removing excess hardmask 228 material, removing the hardmask 218, and uncovering a top surface of the sacrificial contact plugs 216. As illustrated, in the present embodiment, the CMP process does not completely remove the hardmask 228.

Referring to FIGS. 9A-9B, the sacrificial contact plugs 216 and the dielectric layer 214 are removed by an etching process, or by any suitable process. The etching process may include forming a patterned mask on the first ILD layer 222 that defines the region to be etched. The etching process may include multiple etching steps which may include wet etching, dry etching, or a combination thereof.

In the present embodiment, after removing the sacrificial contact plugs 216 and the dielectric layer 214, the substrate 210 is etched to define source and drain (S/D) regions 230. The portions of the S/D regions 230 that are etched within the substrate 210 may be referred to as S/D well regions. The S/D regions 230 are bounded on two sides by the spacers 220 and have at least one spacer 220 in common with the gate structure 226. The etching process may include multiple etching steps which may include wet etching, dry etching, or a combination thereof. In alternative embodiments, where the substrate 210 is not etched (i.e., no well regions) the S/D regions 230 are defined over the substrate 210 and within the gate spacers 220.

Referring to FIGS. 10A-10B, a material is epitaxially (epi) grown over the exposed surface of the substrate 210 in the S/D regions 230, thereby forming S/D features 232. The epi grown S/D features may include germanium (Ge), silicon germanium (SiGe), silicon carbide (SiC), or other suitable materials. The epitaxy process may include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition (e.g., silicon) of the substrate 210. The S/D features 232 may be implanted with p-type or n-type dopants or impurities such that strained S/D features are formed. In the present embodiment, the S/D features 232 are raised such that they extend beyond the top surface of the substrate 210. In alternative embodiments, the are not raised. In alternative embodiments, where the S/D regions are not formed by etching the substrate 210 (i.e., no well regions), the epi material is grown over the top surface of the substrate 210 in the S/D regions 230.

Still referring to FIGS. 10A-10B, formed over the S/D features 232 are contacts 234. Forming the contacts 234 may include, for example, depositing a metal layer over the S/D features 232 to form silicide, or may include a process that forms any suitable low contact resistance material over the S/D features 232. Where silicide is formed, the metal layer for silicide may include titanium, nickel, cobalt, platinum, palladium tungsten, tantalum, erbium or other suitable materials. An annealing process with a proper temperature is applied to the semiconductor device 200 such that the metal layer and the silicon of the S/D features 232 react to form silicide on the top surface of the S/D features. The formed silicide may be in any proper composition and phase, determined by various parameters including the annealing temperature and the thickness of the metal layer. In some embodiments, a metal barrier may be formed over the silicide layer, thereby improving reliability. Thereafter, contacts 234 are formed over the silicide for providing electrical connection with the S/D features 232. The contacts 234 may include a metal such as aluminum (Al), tungsten (W), and copper (Cu). The first interconnect structures 230 may be formed by chemical vapor deposition (CVD), physical vapor deposition (PVD), atomic layer deposition (ALD), high density plasma CVD (HDPCVD), plating, other suitable methods, and/or combinations thereof.

Referring to FIGS. 11A-11C, a second ILD layer 236 is formed over the first ILD layer 222. The second ILD layer 236 may include silicon oxide, silicon oxynitride, a low-k material, or other suitable materials. In the present embodiment, the second ILD layer 236 includes silicon oxide. The second ILD layer 236 may be formed by chemical vapor deposition (CVD), high density plasma CVD (HDP-CVD), spin-on, physical vapor deposition (PVD or sputtering), or other suitable methods. The CVD process, for example, may use chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$). After the second ILD layer 236 is formed, a CMP process may be performed to planarize the top surface of the device 200 and remove excess material of the second ILD layer 236.

Still referring to FIGS. 11A-11C, a gate contact 238 is formed through the second ILD layer 236. The gate contact 238 may be formed by first etching an opening through the second ILD layer 236 and through the hardmask 228 directly over the gate structure 226. The etching process may be a single or a multiple step etching process. The etching process may include wet etching, dry etching, or a combination thereof.

After etching, the gate contact 238 is formed by depositing a material in the opening such that gate contact 238 is in electrical connection with the gate structure 226. The gate contact 238 may include a metal such as Al, W, or Cu. The gate contact 238 may be formed by chemical vapor deposition (CVD), physical vapor deposition (PVD), atomic layer deposition (ALD), high density plasma CVD (HDPCVD), plating, other suitable methods, and/or combinations thereof. As illustrated in FIG. 11C (which illustrates a diagrammatic cross-section view along line b-b of FIG. 11A), the gate contact 238 is in electrical contact with the gate structure 226 in a portion of the gate structure 226 that is outside the active region 211, surrounded on at least two sides by the first ILD layer 222, and overlies the isolation region 212. It is understood that depending on design requirements, the gate contact 238 may be formed within the active region 211 (such that it dissected by line a-a of FIG. 11A) and over the gate structure 226. It is understood that each of the gate structures 226 may include a gate contact 238.

An interconnect 240 may be formed through etched portions of the second ILD layer 236 for connecting to the S/D features 232 of the semiconductor device 200. The interconnect 240 may include a metal such as Al, W, or Cu or polysilicon, or other suitable materials. As illustrated in FIG. 11B, interconnect 240 is in electrical contact with the contact 234 within the active region 211 of the substrate 210. It is understood that each of the contacts 234 may include an interconnect 240.

Thus, with continued reference to FIGS. 11A-11C, illustrated is a semiconductor device 200 that includes a semiconductor substrate 210 including a device region. The device region includes a device that has a gate structure 226, gate spacers 220 disposed on sidewalls of the gate structure 226, and source and drain features 232. The device region further includes another device that has a gate structure 226, gate spacers 220 disposed on sidewalls of the gate structure 226, and source and drain features 232. As illustrated, a common source and drain feature 232 (in the center) is shared between the devices. Formed over the common source and drain feature 232 is an interconnect structure 234. The interconnect structure 234 is in electrical contact with the common source and drain feature 232 and in contact with a gate spacer 220. It is understood that although FIGS. 11A-11C illustrate only one gate contact and only one interconnect structure, multiple such structures may be present, depending upon design requirements. It is also understood that although FIGS. 11A-11C illustrate only two gate structures, and only three connects formed over three S/D features, any number of such structures may be present, depending upon design requirements. It is further understood that the active region may include various types of other active devices, passive devices, wiring, contacts, multiple layers, and interconnect structures.

The above method 100 provides for an improved alignment (self-alignment) process to form connections to S/D features thereby relaxing the overlay control, reducing manufacturing cost, and device reliability when compared with traditional manufacturing processes. For example, because the contacts to the S/D features are self-aligned contacts (i.e., formed without a need for contact patterning) there are no overlay issues with respect to forming the contacts. Further, because there is no need for contact patterning, cost reduction is realized because additional patterning/etching steps is eliminated. Also, because the contacts are self-aligned, there is no risk of shorting the contact to other structures (e.g., contact-to-gate short). Moreover, the method 100 can be easily implemented into current manufacturing process and technology, thereby lowering cost and minimizing complexity. Different embodiments may have different advantages, and no particular advantage is necessarily required of any embodiment.

Thus, provided is a semiconductor device. An exemplary semiconductor device includes a semiconductor substrate including an active region including a plurality of device regions. The semiconductor device further includes a first device disposed in a first device region of the plurality of device regions, the first device including a first gate structure, first gate spacers disposed on sidewalls of the first gate structure, and first source and drain features. The semiconductor device further includes a second device disposed in a second device region of the plurality of device regions, the second device including a second gate structure, second gate spacers disposed on sidewalls of the second gate structure, and second source and drain features, the second and first source and drain features having a source and drain feature in common. The semiconductor device further includes a contact feature disposed on the common source and drain feature, the contact feature being in electrical contact with the common source and drain feature.

In some embodiments, the semiconductor device further comprises other contact features disposed on other source and drain feature of the first and second source and drain features, the other contact features being in electrical contact the other source and drain features; an isolation region surrounding the active region, the isolation region configured to isolate the active region from other active regions of the semiconductor device; a first interlayer dielectric (ILD) layer disposed over the isolation region and surrounding the active region; a second ILD layer disposed over the first ILD layer and over the first and second device regions; a gate contact feature extending through the second ILD layer in contact with the gate structure of the first device; and an interconnect feature extending through the second ILD layer and in contact with a contact feature of the other contact features. In certain embodiments, the semiconductor device further comprises a silicide layer disposed on the first and second source and drain features, the silicide layer being interposed between the first and second source and drain features and the contact feature disposed on the common source and drain feature. In certain embodiments, the semiconductor device further comprises a metal barrier disposed on the first and second source and drain features, the metal barrier being interposed between the silicide layer and the contact feature of the common source and drain feature.

In some embodiments, the contact feature of the common source and drain feature is in contact with a gate spacer of the first gate spacers and a gate spacer of the second gate spacers. In various embodiments, a portion of the gate structure of the first device extends beyond the active region, the gate contact feature is formed over the portion of the gate structure of the first device that extends beyond the active region. In certain embodiments, the gate structure of the first device includes a high-k dielectric and a metal conductor, and the gate contact feature includes a material selected from the group consisting of aluminum (Al), tungsten (W), and copper (Cu). In further embodiments, the first and second devices are selected from the group consisting of a PMOS FET device and a NMOS FET device.

Also provided is an alternative embodiment of a semiconductor device. The exemplary semiconductor device includes a substrate and a gate structure formed on an active region of the substrate. The semiconductor device further includes a first gate spacer disposed on a first sidewall of the gate structure. The semiconductor device further includes a second gate spacer disposed on a second sidewall of the gate structure. The semiconductor device further includes a first source and drain feature disposed one side of the gate structure, the first source and drain feature being bounded by a first well structure defined within the substrate. The semiconductor device further includes a second source and drain feature disposed on another side of the gate structure, the second source and drain feature being bounded by a second well structure defined within the substrate. The semiconductor device further includes a first connect feature disposed on the first source and drain feature, the first connect feature being in electrical contact with the first source and drain feature and extending across a top surface of the first source and drain feature such that the top surface of the first source and drain feature is substantially covered by the first contact feature. The semiconductor device further includes a second connect feature disposed on the second source and drain feature, the second connect feature being in electrical contact with the second source and drain feature and extending across a top surface of the second source and drain feature such that the top surface of the second source and drain feature is substantially covered by the second contact feature.

In some embodiments, the semiconductor device further comprises another gate structure formed on the active region of the substrate and adjacent to the first gate structure, wherein the another gate structure is separated by the second connect feature, and wherein the second source and drain feature and the second contact feature are shared with the another gate structure. In certain embodiments, the semiconductor device further comprises a hardmask layer formed over a top surface of the gate structure; an interlayer dielectric (ILD) layer disposed over the hardmask and over the first and second connect features; and a gate contact feature extending through the ILD layer and through the hardmask layer and in contact with the gate structure.

In some embodiments, a portion of the gate structure extends beyond the active region of the substrate and over an isolation region of the substrate, and the gate contact feature is in contact with the portion of the gate structure that extends beyond the active region of the substrate. In certain embodiments, the gate structure includes a high-k dielectric and a metal conductor, and the first and second contact features include a material selected from the group consisting of aluminum (Al), tungsten (W), and copper (Cu).

Also provided is a method for forming a semiconductor device. The exemplary method includes providing a substrate including an active region and an isolation region, forming first and second sacrificial contact plugs on the substrate, and forming first spacers on sidewalls of the first contact plug and second spacers on sidewalls of the second sacrificial contact plug. The method further includes forming a gate structure in a region between the first and second sacrificial contact plugs and over the substrate, the gate structure being in contact with a spacer of the first spacers and a spacer of the second spacers. The method further includes selectively removing the first and second sacrificial contact plugs to define first and second source and drain regions. The method further includes epitaxially growing first and second source and drain features in the first and second source and drain regions. The method further includes forming first and second contact features over the first and second source and drain features, the first and second contact features being in electrical contact with the first and second source and drain features.

In some embodiments, the method further includes forming a silicide layer over the first and second source and drain features and between the first and second contact features; etching back the gate structure; forming a hardmask over the etched back gate structure; and forming an interlayer dielectric (ILD) layer over the hardmask and over the first and second contact features. In certain embodiments, the method further includes forming a gate contact extending through the ILD layer and through the hardmask, the gate contact being in electrical contact with the gate structure; and forming first and second interconnect features extending through the ILD layer, the first and second interconnect features being in electrical contact with the first and second contact features.

In some embodiments, defining the first and second source and drain regions further includes etching the substrate thereby defining first and second wells of the first and second source and drain regions. In various embodiments, the second source and drain feature is common to both the gate structure and another gate structure formed on an opposing side of the second source and drain feature. In certain embodiments, forming the gate structure includes: forming another ILD layer over the first and second sacrificial contact plugs; patterning the another ILD layer, thereby removing the another ILD layer in the region between the first and second contact plugs; and depositing a high-k dielectric material and a metal material to thereby form the gate structure. In further embodiments, the first and second sacrificial contact plugs include polysilicon, the first and second spacers include silicon nitride, and the another ILD layer includes silicon oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductor substrate including an active region including a plurality of device regions;
   a first device disposed in a first device region of the plurality of device regions, the first device including a first gate structure, first gate spacers disposed on sidewalls of the first gate structure, and first source and drain features;
   a second device disposed in a second device region of the plurality of device regions, the second device including a second gate structure, second gate spacers disposed on sidewalls of the second gate structure, and second source and drain features, the first and second source and drain features having a source and drain feature in common; and
   a contact feature disposed on the common source and drain feature and interposed between the first and second gate spacers, the contact feature including a first surface in electrical contact with the common source and drain feature and an opposing second surface;
   wherein a first sidewall of the contact feature is in continuous contact with a gate spacer of the first gate spacers from the first surface to the second surface, and wherein a second sidewall of the contact feature is in continuous contact with gate spacer of the second gate spacers from the first surface to the second surface,
   wherein a portion of the first gate structure extends beyond the active region and is in contact with a gate contact feature that extends vertically over the portion of the first gate structure without extending vertically over the active region.

2. The semiconductor device of claim 1 further comprising:
   other contact features disposed on the first and second source and drain features, the other contact features being in electrical contact with the first and second source and drain features;
   an isolation region surrounding the active region, the isolation region configured to isolate the active region from other active regions of the semiconductor device;
   a first interlayer dielectric (ILD) layer disposed over the isolation region and surrounding the active region;
   a second ILD layer disposed over the first ILD layer and over the first and second device regions; and
   an interconnect feature extending through the second ILD layer and in contact with a contact feature of the other contact features, wherein the contact feature of the common source and drain feature further includes a third sidewall and an opposing fourth sidewall, wherein the third and fourth sidewalls are in contact with the second ILD layer.

3. The semiconductor device of claim 1 further comprising:
a silicide layer disposed on the first and second source and drain features, the silicide layer being interposed between the first and second source and drain features and the contact feature disposed on the common source and drain feature.

4. The semiconductor device of claim 3 further comprising:
a metal barrier disposed on the first and second source and drain features, the metal barrier being interposed between the silicide layer and the contact feature of the common source and drain feature.

5. A semiconductor device comprising:
a semiconductor substrate including an active region including a plurality of device regions;
a first device disposed in a first device region of the plurality of device regions, the first device including a first gate structure, first gate spacers disposed on sidewalls of the first gate structure, and first source and drain features;
a second device disposed in a second device region of the plurality of device regions, the second device including a second gate structure, second gate spacers disposed on sidewalls of the second gate structure, and second source and drain features, the first and second source and drain features having a source and drain feature in common; and
a contact feature disposed on the common source and drain feature, the contact feature being in electrical contact with the common source and drain feature,
wherein the contact feature of the common source and drain feature is in continuous contact with a sidewall of the first gate spacers and in continuous contact with a sidewall of the second gate spacers,
wherein a portion of the first gate structure extends beyond the active region and is in contact with a gate contact feature that extends vertically over the portion of the first gate structure without extending vertically over the active region.

6. The semiconductor device of claim 2 wherein the gate structure of the first device includes a high-k dielectric and a metal conductor, and
wherein the gate contact feature includes a material selected from the group consisting of aluminum (Al), tungsten (W), and copper (Cu).

7. The semiconductor device of claim 1 wherein the first and second devices are selected from the group consisting of a PMOS FET device and a NMOS FET device.

8. A semiconductor device comprising:
a substrate;
a gate structure formed on an active region of the substrate;
a first gate spacer disposed on a first sidewall of the gate structure;
a second gate spacer disposed on a second sidewall of the gate structure;
a first source and drain feature disposed on one side of the gate structure, the first source and drain feature being bounded by a first well structure defined within the substrate;
a second source and drain feature disposed on another side of the gate structure, the second source and drain feature being bounded by a second well structure defined within the substrate;
a first connect feature disposed on the first source and drain feature, wherein a bottom surface of the first connect feature extends across a top surface of the first source and drain feature such that the top surface of the first source and drain feature is substantially covered by the bottom surface of the first connect feature, wherein the first connect feature includes a first sidewall in continuous contact with the first gate spacer from the bottom surface of the first connect feature to a top surface of the first connect feature; and]
a second connect feature disposed on the second source and drain feature, wherein a bottom surface of the second connect feature extends across a top surface of the second source and drain feature such that the top surface of the second source and drain feature is substantially covered by the bottom surface of the second connect feature, wherein the second connect feature includes a second sidewall in continuous contact with the second gate spacer from the bottom surface of the second connect feature to a top surface of the second connect feature;
wherein a portion of the gate structure extends beyond the active region and is in contact with a gate contact feature that extends vertically over the portion of the gate structure without extending vertically over the active region.

9. The semiconductor device of claim 8 further comprising:
another gate structure formed on the active region of the substrate and adjacent to the first gate structure,
wherein the another gate structure is separated by the second connect feature, and
wherein the second source and drain feature and the second connect feature are shared with the another gate structure.

10. The semiconductor device of claim 8 further comprising:
a hardmask layer formed over a top surface of the gate structure; and
an interlayer dielectric (ILD) layer disposed over the hardmask and over the first and second connect features,
wherein the gate contact feature extends through the ILD layer and through the hardmask layer.

11. The semiconductor device of claim 8 wherein the gate structure includes a high-k dielectric and a metal conductor, and
wherein the first and second connect features include a material selected from the group consisting of aluminum (Al), tungsten (W), and copper (Cu).

12. The semiconductor device of claim 5 further comprising:
an isolation region surrounding the active region, the isolation region configured to isolate the active region;
a first interlayer dielectric (ILD) layer disposed over the isolation region and surrounding the active region;
a second ILD layer disposed over the first ILD layer and over the first and second device regions;
a gate contact feature extending through the second ILD layer in contact with the gate structure of the first device; and
wherein the contact feature of the common source and drain feature further includes a third sidewall and an opposing fourth sidewall, wherein the third and fourth sidewalls are in contact with the second ILD layer.

13. The semiconductor device of claim 5 further comprising:
a silicide layer disposed on the first and second source and drain features, the silicide layer being interposed between the first and second source and drain features and the contact feature disposed on the common source and drain feature.

14. The semiconductor device of claim 12 wherein a portion of the gate structure of the first device extends beyond the active region, and wherein the gate contact feature is formed over the portion of the gate structure of the first device that extends beyond the active region.

15. The semiconductor device of claim 12 wherein the gate structure of the first device includes a high-k dielectric and a metal conductor, and wherein the gate contact feature includes a material selected from the group consisting of aluminum (Al), tungsten (W), and copper (Cu).

16. The semiconductor device of claim 5 wherein the first and second devices are selected from the group consisting of a PMOS FET device and a NMOS FET device.

* * * * *